United States Patent
Han (10) Patent No.: US 6,560,465 B1
(45) Date of Patent: May 6, 2003

(54) METHOD AND APPARATUS FOR CONTROLLING AND MAINTAINING A TOWER TOP LOW NOISE AMPLIFIER

(75) Inventor: Dong-Soo Han, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/222,382

(22) Filed: Dec. 29, 1998

(30) Foreign Application Priority Data

Dec. 29, 1997 (KR) .............................. 97-76540

(51) Int. Cl.⁷ .............................. H04B 1/38; H04M 1/00
(52) U.S. Cl. .................. 455/562; 455/67.1; 455/9; 455/115
(58) Field of Search ................... 455/561, 67.1, 455/67.4, 115, 423, 424, 562, 8, 9; 330/51, 151, 150, 124.8

(56) References Cited

U.S. PATENT DOCUMENTS

| | | | |
|---|---|---|---|
| 4,565,972 A | 1/1986 | Kaegebein | .............. 330/124 D |
| 4,627,098 A | 12/1986 | Dolikian et al. | .............. 455/70 |
| 5,418,490 A * | 5/1995 | Kaegebein | .............. 330/124 D |
| 5,761,614 A * | 6/1998 | Leitch et al. | ................ 455/254 |
| 6,047,199 A * | 4/2000 | DeMarco | ..................... 455/572 |
| 6,151,482 A * | 11/2000 | Eriksson | ..................... 455/67.1 |
| 6,169,451 B1 * | 1/2001 | Kim | ........................ 330/124 D |
| 6,236,265 B1 * | 5/2001 | Faerber | ........................ 330/51 |

* cited by examiner

*Primary Examiner*—Vivian Chin
*Assistant Examiner*—John J Lee
(74) *Attorney, Agent, or Firm*—Dilworth & Barrese, LLP (57) ABSTRACT

A method and apparatus for controlling and maintaining a tower top low noise amplifier (TTL) module coupled to an antenna, where the TTL module includes a plurality of TTLs, each for amplifying signals received by the antenna on an associated cell sector. The method includes: reading alarm information concerning alarm conditions present in the TTL module during a read mode; and, writing commands to control circuitry coupled to the TTL module in a write mode to control switching states of bypass switches therein in response to the alarm information.

15 Claims, 9 Drawing Sheets

| FUNCTION / BITS | D0 | D1 | D2 | D3 |
|---|---|---|---|---|
| BYPASS ALL THE SIGNALS | 0 | 0 | 0 | 0 |
| CONTROL THE α | 1 | 0 | 0 | 0 |
| CONTROL THE β | 0 | 1 | 0 | 0 |
| CONTROL THE γ | 0 | 0 | 1 | 0 |
| ALL THE SWITCHES OFF | 0 | 0 | 0 | 1 |

| FUNCTION / BITS | D0 | D1 | D2 |
|---|---|---|---|
| BYPASS ALL THE SIGNALS | 0 | 0 | 0 |
| α SWITCH ON | 1 | 0 | 0 |
| β SWITCH ON | 0 | 1 | 0 |
| γ SWITCH ON | 1 | 1 | 0 |
| α SWITCH OFF | 0 | 0 | 1 |
| β SWITCH OFF | 1 | 0 | 1 |
| γ SWITCH OFF | 0 | 1 | 1 |
| ALL THE SWITCHES OFF | 1 | 1 | 1 |

METHOD AND APPARATUS FOR CONTROLLING AND MAINTAINING A TOWER TOP LOW NOISE AMPLIFIER

BACKGROUND OF THE INVENTION

1. Field of the Invention

The present invention relates generally to wireless communications equipment and more particularly to a method and apparatus for controlling and maintaining a tower top low noise amplifier.

2. Description of the Related Art

When an antenna located at the top of a tower is distant from the base station communication equipment it connects to, excessive signal attenuation through tower to ground cabling can produce an increase in the signal to noise ratio of signals received by the antenna. To alleviate this problem, a tower top low noise amplifier (hereafter, "TTL", not to be confused with transistor-transistor logic) is typically employed at the base of the antenna on the tower to immediately amplify receive signals and thereby prevent deterioration of signal quality. The TTL acts as a preamplifier to the main low noise amplifier (LNA) of the receiving equipment at the bottom of the tower.

Since tower top amplifiers are oftentimes difficult to access due to their location on the tower top, it is customary to utilize some sort of automatic bypassing mechanism in the event of a TTL failure. One example of such a bypassing scheme is disclosed in U.S. Pat. No. 5,418,490 which employs both primary and backup amplifiers at the tower top. The system in that patent generates a primary failure signal in the event of an abnormal current draw of the primary amplifier, whereupon the backup amplifier is automatically switched into operation. If the backup amplifier fails, a backup failure signal is generated to switch in a bypass circuit in place of the backup amplifier.

SUMMARY OF THE INVENTION

In an illustrative embodiment of the present invention, there is provided an apparatus for controlling and maintaining a tower top low noise amplifier (TTL) module coupled to an antenna, where the TTL module has a plurality of TTLs, each for amplifying signals received by the antenna on an associated cell sector. The apparatus includes a control box configured to control the TTL module and to determine whether or not an alarm condition is present, and to control bypass switches, each associated with a TTL, so as to route receive signals from the antenna to a bypass path when an alarm condition is present. An alarm board, interfaced with the control box, functions to receive data indicative of alarm conditions within the TTL module and to transmit write commands to the control box in response to commands from a base transceiver system control processor (BCP), where the write commands serve to selectively control the bypass switches within the TTL module.

An illustrative method of the present invention for controlling and maintaining a tower top low noise amplifier module coupled to an antenna includes: reading alarm information concerning alarm conditions present in the TTL module during a read mode; and, writing commands to control circuitry coupled to the TTL module in a write mode to control switching states of bypass switches therein in response to the alarm information.

BRIEF DESCRIPTION OF THE DRAWINGS

For a better understanding of the present invention, reference is made to exemplary embodiments thereof, taken in conjunction with the accompanying drawings in which like reference numerals indicate like elements or features, wherein.

DETAILED DESCRIPTION OF THE PREFERRED EMBODIMENTS

Figure 1:
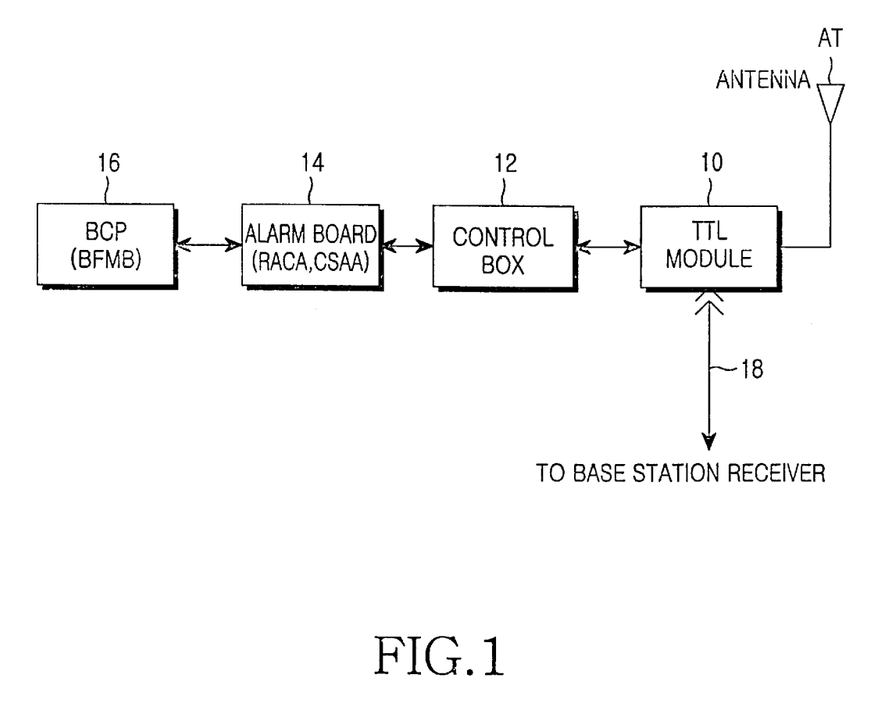
FIG. 1 is a block diagram of a TTL controlling module arrangement.

Referring to FIG. 1, a block diagram of a tower top low noise amplifier controlling module arrangement is shown. A tower top low noise amplifier module 10 includes a number of TTLs, each of which amplifies signals received by an antenna AT and routes the amplified signals through a coaxial cable (or cables) 18 that runs down the tower to the base station receiver. A control box 12 controls TTL module 10 and monitors whether or not an alarm condition is present, which indicates that a TTL therein has failed or is in dancer of failing. When an alarm condition is present, control box 12 changes the switching state of a switch within TTL module 10 so as to turn off the TTL or switch the TTL out of operation and switch in a bypass circuit or path within TTL module 10 in its place. When a base station manager or automated test system desires to control the TTL or TTL switch in order to perform a VSWR test (e.g., on the antenna/antenna cables), Base Transceiver System (BTS) Control Processor (BCP) 16 writes a corresponding command to the control box 12, which responds with an appropriate control signal to TTL module 10.

The alarm board 14, comprised of a Rack Alarm Control Assembly (RACA) and a Cell Site Alarm Assembly (CSAA), interfaces with control box 12 and receives and stores alarm signals from control box 12 corresponding to alarm conditions present in the TTL module. Alarm board 14 also transmits write commands originating from BCP 16 to control box 12. Alarm board 14 is connected to the BCP 16 through a telephony device bus (TDBus).

A base transceiver system (BTS) fault measurement block (BFMB), located in the BTS, collects and manages the various alarms reported to BCP 16 by alarm board 14. The BFMB reads the register of the alarm board received through the TDBus to gather alarm information, and transmits the alarms to the base station manager. The BFMB also conducts the TTL write operation upon receipt of the TTL write command from the BSM, and controls the TTL switch when testing the VSWR.

In order to control the TTL module 10, read and write modes are utilized. These modes are as follows:

1. Read Mode

In the alarm board 14, each pin is allocated for a respective alarm. If an alarm condition is present in TTL module 10, information indicating the same is reported to the corresponding pin of the alarm board.

Figure 2:
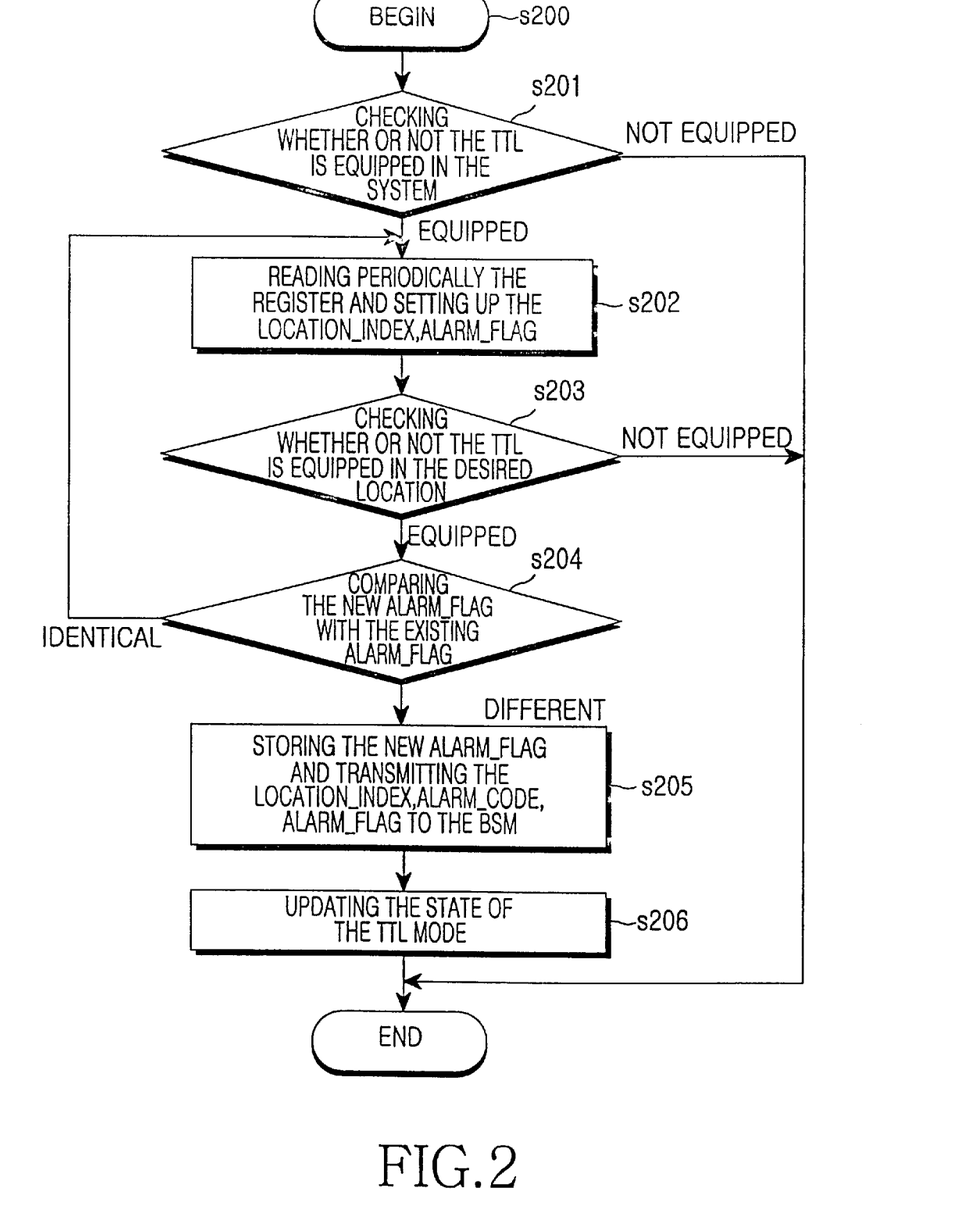
FIG. 2 is a flow chart depicting a read mode of a method for controlling and maintaining the TTL in accordance with the present invention.

FIG. 2 is a flow chart of an exemplary routine by which the BFMB periodically reads data on the alarm board pins and monitors whether or not an alarm has occurred in TTL module 10. In this example, a pin value of 0 indicates a normal condition and a pin value of 1 indicates an alarm condition. The routine first checks in step s201 whether or not the corresponding system is equipped with a TTL module by reading data stored in program memory. If the system is so equipped, a register corresponding to the TTL module is periodically read by the alarm board RACA through the TDBus, and a location index and alarm flag corresponding to the read register bit are set in an alarm table (step s202). (If the system is not equipped with a TTL module, the process terminates in step s210.) Next, in step s203, a check is performed to ascertain whether or not the TTL module is equipped in the desired location by comparing the location index to values stored in memory. If the TTL is not equipped in the desired location, the procedure is terminated (step s210). Other vise, the set alarm flag is compared with the previous alarm flag stored in a buffer (step s204).

If the set alarm flag is different from the previous alarm flag, the alarm flag is updated and the location index, alarm code, and alarm flag are transmitted to the Base Station Manager (BSM) in step s205. The transmitted alarm information is reported to the administrator, and the TTL mode is updated according to the alarm results (step s206).

Figure 9:
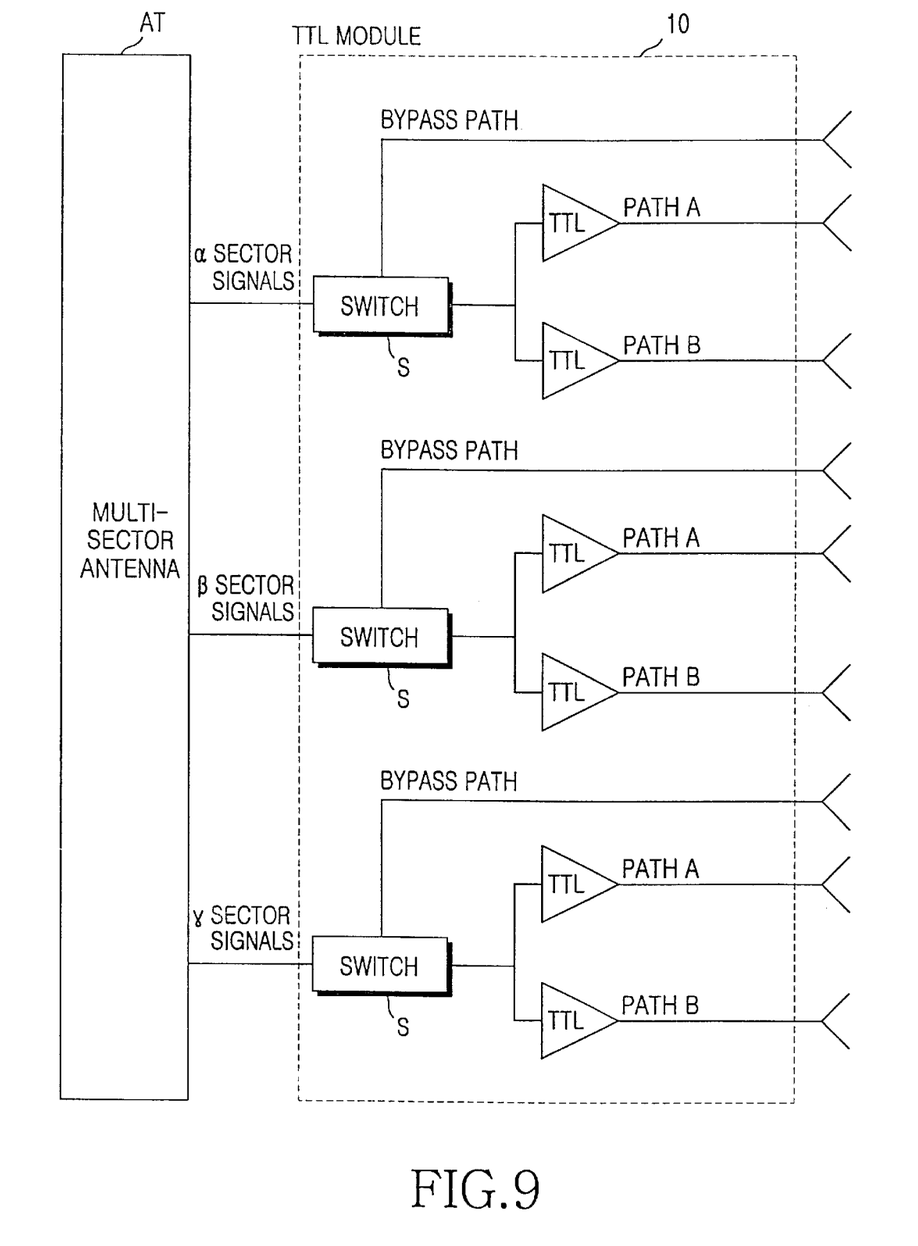
FIG. 9 is a block diagram illustrating tower top amplifiers and associated switches within a tower top amplifier module.

Referring to FIG. 9, a simplified block diagram of an exemplary TTL module 10 is shown. TTL module 10 is designed to amplify signals received by a multi-sector antenna AT, which, in this example, separately outputs signals from three sectors, α, β and γ. The receive signals of each sector are normally provided to a pair of TTLs in two paths, A and B. At the input of each TTL pair is a single pole, double throw switch S which ordinarily routes the incoming signal to the TTL pair. However, if an alarm condition exists in one of the TTLs in the corresponding TTL pair, the switch is controlled to route the receive signal to a bypass path.

Figure 3:
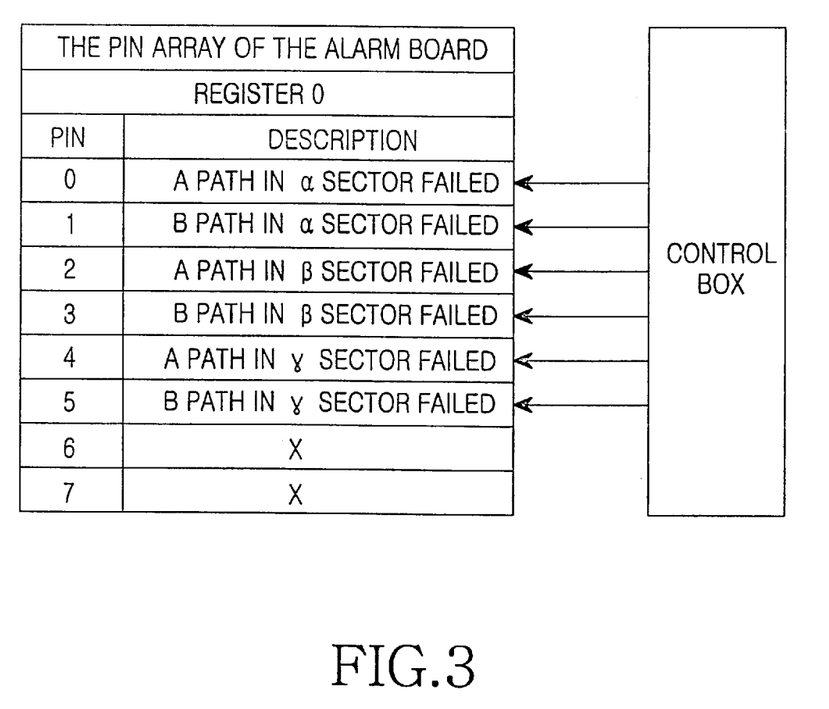
FIG. 3 is a schematic diagram of a pin array of the read mode of FIG. 2.

FIG. 3 illustrates respective pins allocated in the alarm board and the related alarm information. The alarms are transmitted from control box 12. Each pin is associated with an alarm condition for one of the TTLs in TTL module 10. Thus, the logic level of pin 0 indicates whether an alarm condition is present in the TTL of path A in sector α, the logic level of pin 3 indicates whether an alarm condition is present in the TTL of path B of sector β, and so forth.

If an alarm occurs in a TTL, the associated switch in the TTL path is turned on, and the signals received from the antenna bypass the TTL having the alarm condition. Therefore, managing the operation state of a TTL is identical to managing the operation state of the associated switch mode of that TTL. The BFMB has a state-managing buffer to manage the alarm state of TTL module 10.

2. Write Mode

When a user inputs a command to the base station manager to conduct a VSWR test diagnosing the antenna path, or to manually turn on one of the TTL bypass switches, the BFMB receives the command to perform these operations, and responds by performing the write operation to TTL module 10 through the alarm board.

The write method may be classified into two types according to the number of bits controlling the write operation. The first approach controls the corresponding TTL switch by utilizing one bit. This approach also includes two methods. The first method causes the switch to be turned on upon the detection of a low to high transition of the one bit signal, and to be turned off upon detection of a high to low transition, or vice versa. This is called the rising and falling detection method. In the second method, when a pulse having a constant cycle is inputted, the switch mode is converted by toggling. This is called the pulse method.

Figure 4:
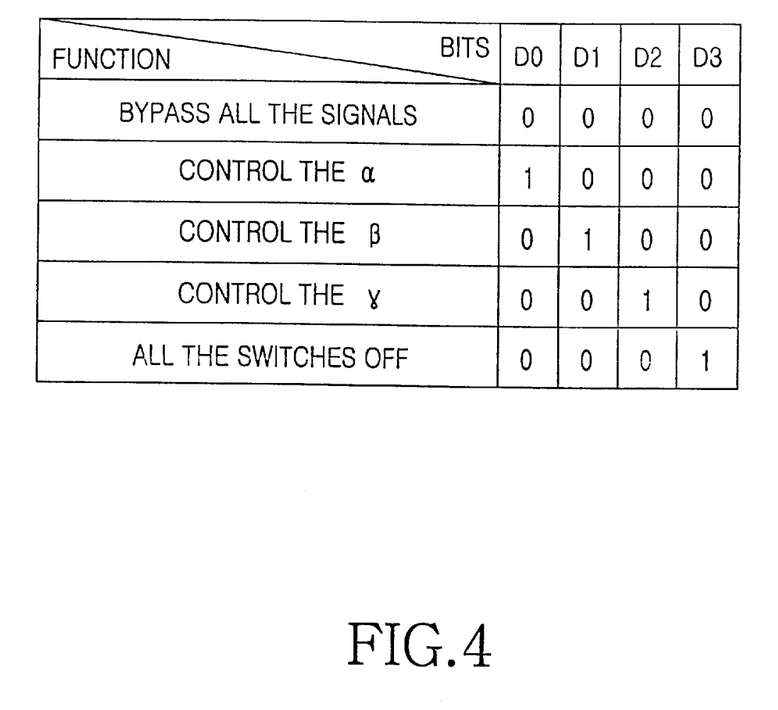
FIG. 4 is a schematic diagram for controlling a write operation utilizing four bits of data.

In the second approach, the corresponding TTL switch is controlled by combining data of a plurality of write pins. This approach can also be performed with two methods. The first method involves using the write data bits. Referring to FIG. 4, a table showing illustrative pin data and corresponding functions is shown. Four data bits D0 to D3 are employed to form code words, each intended to control a unique combination of switching states. For instance, if the four bits form codeword [0000], all the signals are bypassed, if they form codeword [1000] the α sector switch (or switches) is turned on to bypass the corresponding α sector TTL, and so forth. The four bits of D0 to D3 are switched by a toggling method.

Figure 5:
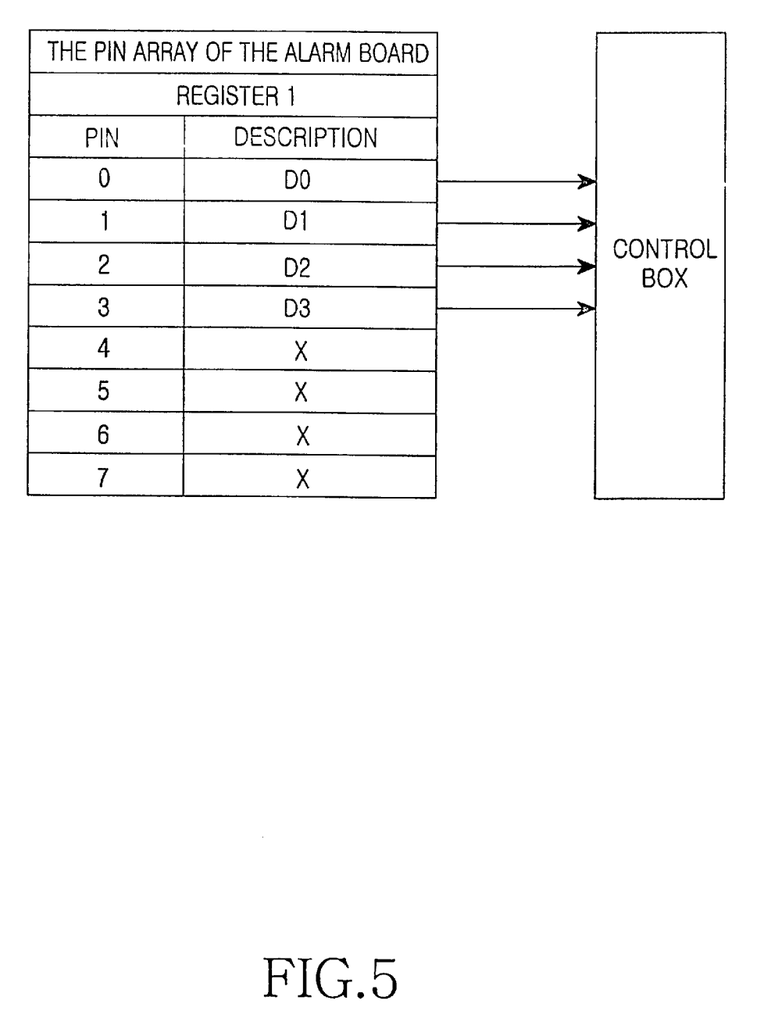
FIG. 5 is a schematic diagram of the pin array of the alarm board for the four bit write operation.

FIG. 5 illustrates the pin array of alarm board 14 writing the information to the control box in the above-described method. If the register bit is 1, pin 0 indicates D0 information, pin 1 indicates D1 information, etc.

Figure 6:
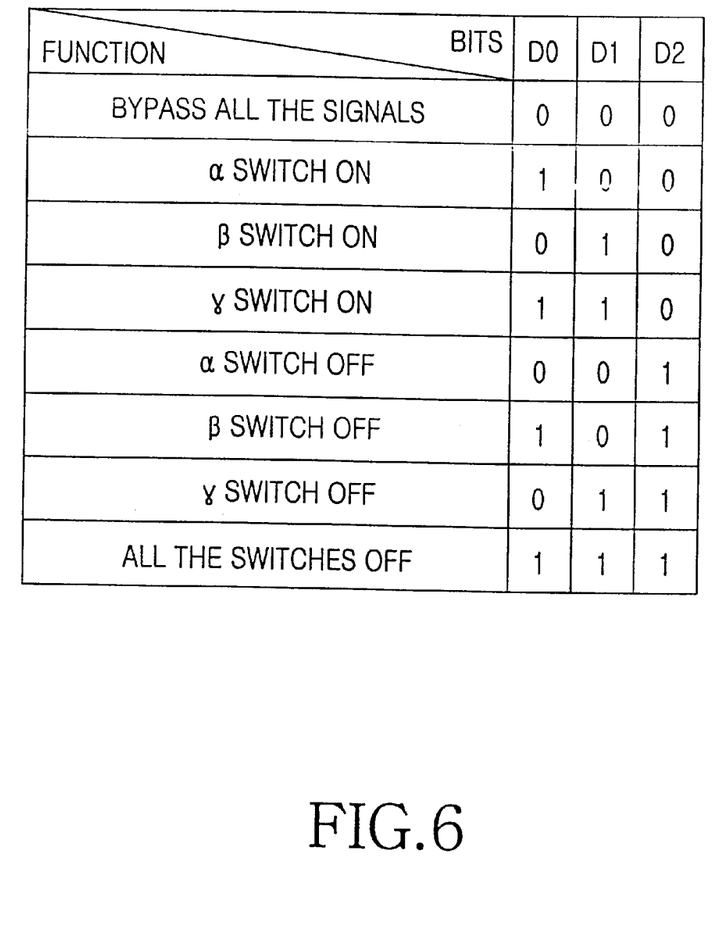
FIG. 6 is a schematic diagram illustrating write operation control utilizing three data bits and a latch.

The second method utilizes 3 bit data and a latch. FIG. 6 shows an illustrative pin description for the 3 bit data method. As illustrated, to control the write mode, 3 data bits D0 to D2 and a latch are employed. If the 3 bits indicate [000], all the signals are bypassed, if the 3 bits indicate [100], the α switch is turned on, and so forth.

Figure 7:
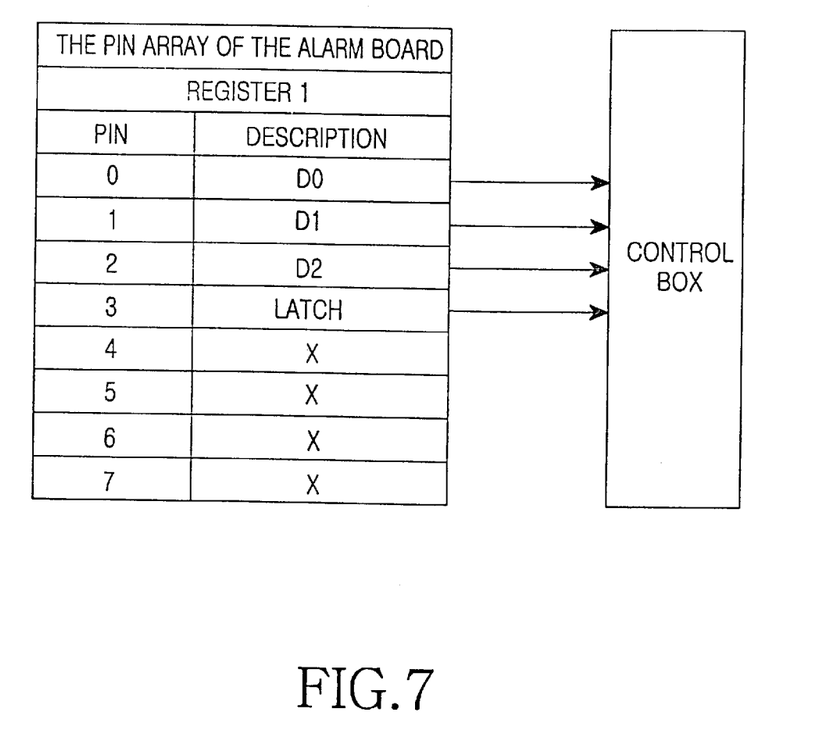
FIG. 7 is a schematic diagram of the pin array of the alarm board for the three bit write case.

FIG. 7 illustrates the pin array of the alarm board writing the information to the control box in the above-discussed method. If the register bit is 1, pins 0, 1 and 2 indicate D0, D1 and D2 information, respectively, and pin 3 indicates latch information.

The BFMB uses a periodic latch signal to write a command corresponding to a specific operation to the alarm board. After reading the inputted bit information, at the moment the latch falls, the control box recognizes the value written to the alarm board, thereby performing the pre-defined operations.

Figure 8:
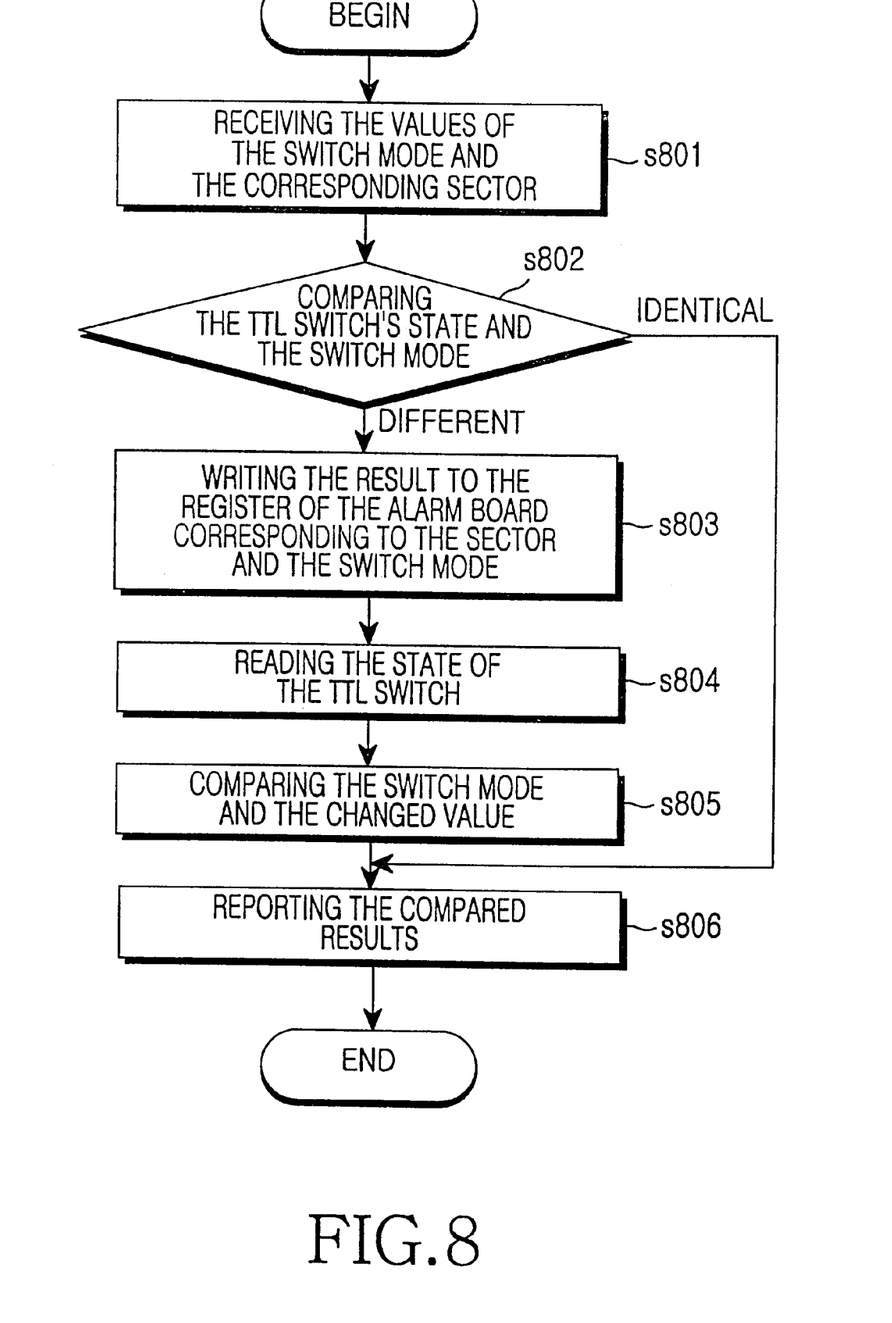
FIG. 8 is a flow chart of a read mode of a method for controlling and maintaining a TTL according to the present invention.

FIG. 8 is a flow chart of an illustrative routine for implementing the write mode operations. The values of the switch mode and the corresponding sector's switch state are first received from the BSM or BTS Diagnostic Block (BDIAB) (step s801). The TTL switch's state of the corresponding sector is then compared to the value of the switch mode (step s802). If the comparison is favorable, the results are reported to the BSM and BDIAB (step s806). If the compared results are different, the compared results are written to the corresponding sector cell and switch mode through the Rack Alarm Control Assembly (step s803). The TTL switch's state is then read in step s804. The switch mode and the updated switch's state are compared in step s805, and the comparison results are reported to the BSM and BDIAB (step s806).

While the present invention has been described above in reference to exemplary embodiments thereof, it is understood that many modifications can be made to these embodiments without departing from the spirit and scope of the invention as defined by the appended claims.

What is claimed is:

1. An apparatus for controlling and maintaining a tower top low noise amplifier (TTL) module coupled to an antenna, said TTL module having a plurality of TTLs, each for amplifying signals received on an associated cell sector, said apparatus comprising:

a control box configured to control said TTL module and to determine whether or not an alarm condition is present, and to control bypass switches each associated with a said TTL so as to route signals received by the antenna to a bypass path when an alarm condition is present; and an alarm board, interfaced with said control box, operative to receive data indicative of alarm conditions within said TTL and to transmit write commands to said control box responsive to commands from a base transceiver system control processor (BCP), said write commands serving to selectively control said bypass switches within said TTL module;

wherein said BCP includes a base transceiver system fault measurement block (BFMB) which is operative to read registers of said alarm box, with register data of said registers being received through a TDBus, in order to collect alarm information of alarm conditions present in said TTL module, and receives a command to write to the TTL module from a base station manager, and when a VSWR test is performed, writing to said TTL module is performed upon receiving the command to write to the TTL module from a base transceiver system diagnostic block (BDIAB).

2. The apparatus as set forth in claim 1, wherein said control box performs a write command received from said BCP responsive to a control signal of a base station manager to control said TTL module, and is further adapted to selectively control said bypass switches so as to perform a VSWR test.

3. The apparatus as set forth in claim 1, wherein said alarm board is comprised of a Rack Alarm Control Assembly (RACA) and a Cell Site Alarm Assembly (CSAA), and is connected to said BCP through a Telephony Device Bus.

4. The apparatus as set forth in claim 1 wherein said BFMB includes a state-managing buffer to manage an alarm state of said TTL module.

5. The apparatus as set forth in claim 1, wherein switching states of said bypass switches are controlled in accordance with 4 bit codewords written to said control box, said 4 bit control words appearing on pins of said alarm board when a register bit is in a first predetermined state.

6. The apparatus as set forth in claim 1, wherein switching states of said bypass switches are controlled in accordance with 3 bit codewords written to said control box, said 3 bit control words appearing on pins of said alarm board when a register bit is in a first predetermined state, with latch information appearing on specific pin of said alarm board.

7. A method for controlling and maintaining a tower top low noise amplifier (TTL) module coupled to an antenna, said TTL module having a plurality of TTLs, each for amplifying signals received by said antenna on an associated cell sector, said method comprising:

reading alarm information concerning alarm conditions present in said TTL module during a read mode; and writing commands to control circuitry coupled to said TTL module in a write mode to control switching states of said bypass switches in response to said alarm information;

wherein a writing operation of said write mode comprises:
receiving values of the switch mode and the corresponding sector cell from a base station manager (BSM) or a BTS Diagnostic Block (BDIAB);
comparing the TTL switch's state of the corresponding sector cell with the value of the switch mode;
reporting the compared results to said BSM and BDIAB, if the compared results are identical;
writing to the corresponding sector cell and switch mode through a Rack Alarm Control Assembly (RACA), if the compared results are different;
reading the TTL switch's state; and comparing the switch mode and the updated switch's state, and reporting the compared results to said BSM and BDIAB.

8. The method as set forth in claim 7, wherein during said read mode, a BTS Fault Measurement Block (BFMB) periodically reads pin values in an alarm board so as to check whether a said alarm condition has occurred in said TTL module.

9. The method as set forth in claim 8, wherein reading said pin values comprises the steps of:

checking whether or not said TTL module is equipped in the corresponding system according to data stored in memory, and applying the checked result to an alarm table;

periodically reading registers corresponding to said TTL module from a Rack Alarm Control Assembly (RACA) through a Telephony Device Bus (TDBus), and setting a location index and an alarm flag corresponding to said registers in said alarm table;

checking whether or not said TTL module is equipped in a corresponding location via a comparison of said location index with stored values;

terminating operation if said TTL module is determined not to be equipped in the corresponding location according to said checked result;

comparing said set alarm flag with the previous alarm flag stored in the buffer, if said TTL is equipped in the corresponding location according to said checked result;

updating the alarm flag, and transmitting the location index, alarm code, and alarm flag to a Base Station Manager, if said set alarm flag is different from said previous alarm flag, in accordance with said comparison; and reporting said transmitted alarm information, and updating a TTL mode according to the alarm results.

10. The method as set forth in claim 9, wherein the alarm information is transmitted from said control box, and pin values in the alarm board are assigned such that individual pins each indicate an alarm condition for a TTL within a particular path of a particular one of said sectors.

11. The method as set forth in claim 7, wherein in said write mode, a BTS Fault Measurement Block (BFMB) in a Base Transceiver System Control Processor (BCP) controls the TTL module upon receiving a command from a base transceiver system diagnostic block (BDIAB) during a VSWR test, and writes to the corresponding TTL through the alarm board, when performing said VSWR test to diagnose the antenna paths.

12. The method as set forth in claim 7, wherein, to control said write mode, a 1 bit signal is utilized to indicate that if said 1 bit signal is switched from low to high, it is accepted as a switch-on, and if said 1 bit is switched from high to low, it is accepted as a switch-off.

13. The method as set forth in claim 7, wherein, to control said write mode, a 1 bit signal is utilized, and whenever a pulse signal having a constant period is inputted, the mode of the present switch is converted by a toggling method.

14. The method as set forth in claim 7, wherein, to control said write mode, codewords containing four bits are utilized, each codeword corresponding to a particular combination of switch states of said bypass switches, and said four bits are switched using a toggling method.

15. The method as set forth in claim 7 wherein, to control said write mode, 3 bit codewords and a latch are utilized, each codeword corresponding to a particular combination of switch states of said bypass switches, and said latch having a pulse.

* * * * *